US009922856B2

(12) United States Patent
Torregrosa et al.

(10) Patent No.: US 9,922,856 B2
(45) Date of Patent: Mar. 20, 2018

(54) ELECTROSTATIC HEATING SUBSTRATE HOLDER WHICH IS POLARISED AT HIGH VOLTAGE

(71) Applicant: ION BEAM SERVICES, Peynier (FR)

(72) Inventors: Frank Torregrosa, Simiane (FR); Laurent Roux, Marseilles (FR)

(73) Assignee: ION BEAM SERVICES, Peynier (FR)

( * ) Notice: Subject to any disclaimer, the term of this patent is extended or adjusted under 35 U.S.C. 154(b) by 0 days.

(21) Appl. No.: 15/117,024

(22) PCT Filed: Feb. 4, 2015

(86) PCT No.: PCT/FR2015/000028
§ 371 (c)(1),
(2) Date: Aug. 5, 2016

(87) PCT Pub. No.: WO2015/118237
PCT Pub. Date: Aug. 13, 2015

(65) Prior Publication Data
US 2017/0178943 A1    Jun. 22, 2017

(30) Foreign Application Priority Data
Feb. 7, 2014 (FR) .................................... 14 00352

(51) Int. Cl.
*H01L 21/683* (2006.01)
*H01L 21/67* (2006.01)
*H01J 37/32* (2006.01)

(52) U.S. Cl.
CPC .... *H01L 21/6833* (2013.01); *H01J 37/32412* (2013.01); *H01L 21/67103* (2013.01); *H01L 21/67248* (2013.01)

(58) Field of Classification Search
CPC .......... H01L 21/6833; H01L 37/32412; H01L 21/67103
See application file for complete search history.

(56) References Cited

U.S. PATENT DOCUMENTS 6,014,082 A * 1/2000 Knutson ................. C23C 16/46
                                                              118/666
6,538,872 B1   3/2003 Wang et al.
(Continued)

FOREIGN PATENT DOCUMENTS

FR    2 985 087 A1    6/2013

OTHER PUBLICATIONS

International Search Report for PCT/FR2015/000028 dated Jun. 15, 2015 [PCT/ISA/210].

*Primary Examiner* — Errol Fernandes
(74) *Attorney, Agent, or Firm* — Sughrue Mion, PLLC

(57) ABSTRACT

The present invention relates to a support comprising:
an electrically conductive biased table (10) connected to a high voltage power supply (12) and supported on an electrically insulating stand (40);
an electrically insulating substrate carrier (20) in the form of a cylinder, its top face presenting a bearing plane designed to receive a substrate (50);
legs (15) standing on the biased table (10) in order to support the bottom face of the substrate carrier (20); and
at least one electrically conductive connection (201, 202, 203, 31, 30) for connecting the bearing plane to the biased table (10).
The support is remarkable in that the substrate carrier (20) incorporates a heating resistance (26).

8 Claims, 1 Drawing Sheet

(56) References Cited

U.S. PATENT DOCUMENTS 7,094,670 B2 8/2006 Collins et al.
2013/0286533 A1 10/2013 Takasaki et al.
2014/0326176 A1* 11/2014 Torregrosa ........ H01L 21/67069
118/500

* cited by examiner

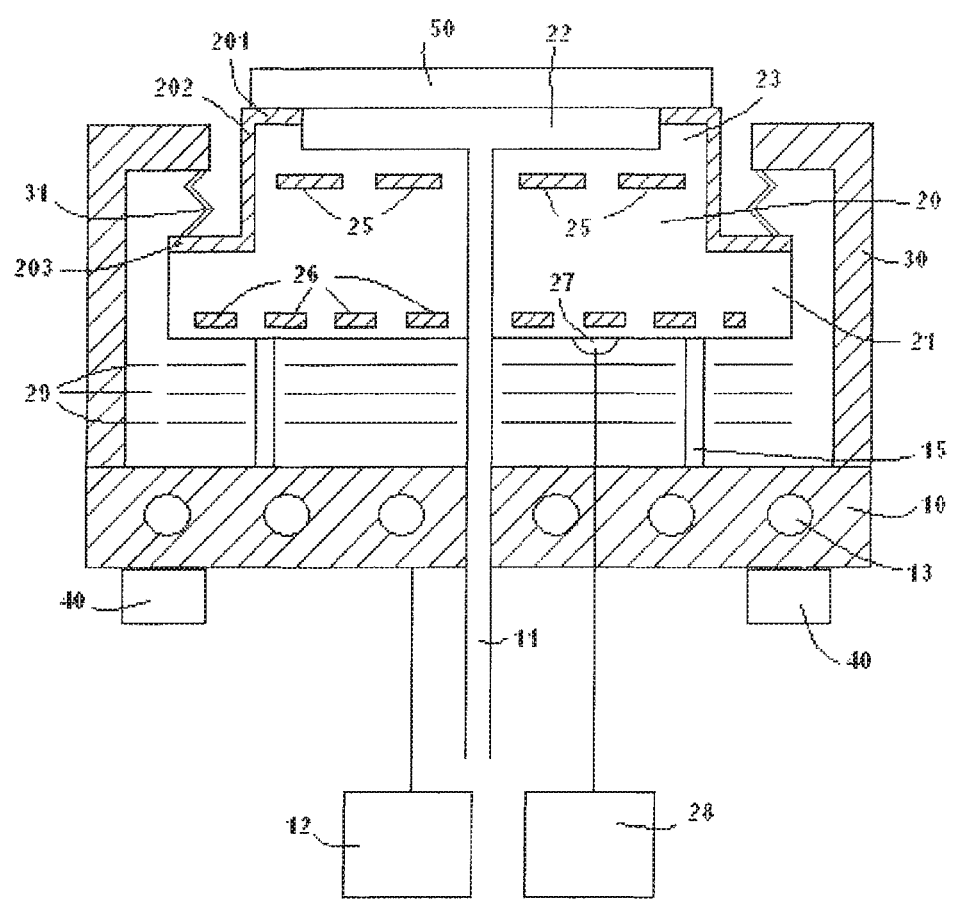

ELECTROSTATIC HEATING SUBSTRATE HOLDER WHICH IS POLARISED AT HIGH VOLTAGE

CROSS REFERENCE TO RELATED APPLICATIONS

This application is a National Stage of International Application No. PCT/FR2015/000028, filed on Feb. 4, 2015, which claims priority from French Patent Application No. 1400352, filed on Feb. 7, 2014, the contents of all of which are incorporated herein by reference in their entirety.

BACKGROUND OF THE INVENTION

The present invention relates to an electrostatic substrate-carrier that is heated and biased at high voltage.

The field of the invention is that of treating substrates in a low pressure atmosphere when the substrates are biased at high voltage.

More particularly, the invention seeks to implant ions that enable impurities to be inserted into the substrate, a technique that is known as doping. Doping serves to modify certain properties of the substrate, which may be mechanical, thermal, electrical, hydrophobic, etc.

In order to perform such implanting, it is nowadays possible to use an ion implanter that operates in plasma immersion mode. Thus, implanting ions in a substrate consists in immersing the substrate in a plasma and in biasing it with a negative voltage of several tens of volts to several tens of kilovolts (generally less than 100 kV), in order to create an electric field capable of accelerating the ions of the plasma towards the substrate so that they become implanted therein. The atoms as implanted in this way are called dopants. The bias is generally pulsed.

In certain applications, it is appropriate to heat the substrate.

Implantation machines are thus known that use infrared lamps for heating the substrate. That situation is appropriate for implanting mechanical parts by means of a plasma that can be said to be "clean" (nitrogen, oxygen, . . . ). It is not appropriate when doping silicon: the plasma used is likely to create interfering deposits on the lamps, thereby masking the radiation and disturbing heating.

Thus, implantation machines are known that make use of enclosures having hot walls. On this topic, reference may be made to the work "Handbook of plasma immersion on implantation and deposition", year 2000, edited by André Anders, published by John Wiley & Sons, ISBN 0-471-24698-0. The exchange of heat between the hot walls and the substrate is poor when the working pressure is very low because there is practically no convection. The exchange of heat by radiation is ineffective if it is desired to raise the substrate to high temperature (higher than 300° C.) since losses are considerable. It is necessary to overdimension the heating power which leads to problems of sealing: behavior of gaskets, deformation of the mechanical components, . . .

Implantation machines are also known that bias the substrate in alternation with a negative voltage and with a positive voltage. The negative alternation attracts ions and it is the alternation used for implanting. The positive alternation attracts electrons that transfer their energy to the substrate, thereby heating it. Temperature is controlled by acting on the duty ratio and/or by acting on the voltage used for accelerating the electrons. That solution is appropriate for treating surfaces of parts that are not sensitive. In microelectronics, and more particularly microelectronics on silicon, high-energy electrons are likely to create defects leading to a reduction in the lifetime of carriers.

Document U.S. Pat. No. 7,094,670 shows the advantage of controlling the temperature of the substrate in order to control etching or parasitic deposition when using a reactive plasma. It shows that the temperature needs to be greater than the threshold needed for depositing materials formed from the gas being used (e.g. polymers of the boron hydride type). Furthermore, the temperature must be below the threshold needed for etching the silicon substrate, regardless of whether it is polycrystalline, monocrystalline, or amorphous. In that document, the temperature of the substrate carrier is controlled by causing a heat transfer fluid to circulate at a stable temperature. The temperature of the substrate depends on the energy flux coming from the plasma and on the thermal resistance between the substrate and the substrate carrier. It follows that the temperature reached depends strongly on the method used. If the heat transfer fluid is heated, its temperature does not exceed 200° C. in practice. Thus, it is possible to reach a high temperature only if use is made of a low density plasma, and/or of a low acceleration voltage, and/or of a low implanting current.

It follows from the above that heating the substrate in the context of implanting ions by plasma immersion is a real problem. The problem is made that much more difficult if use is made of an electrostatic substrate carrier.

The advantages of such a substrate carrier are well known to the person skilled in the art and there is no need to repeat them herein.

On this topic, Document U.S. Pat. No. 6,538,872 teaches an electrostatic substrate carrier having resistive heater means. That system enables the substrate to be heated independently of the parameters of the plasma.

Nevertheless, that substrate carrier cannot be biased at high voltage given its constitution. No provision is made for isolating the various modules constituting the substrate carrier. Furthermore, the module that includes the heater resistance is inserted in a part that is in contact with the substrate carrier proper. The connection between the heater module and the substrate carrier is made by brazed bond layer in order to optimize thermal transfer. The bond layer contains metals such as tin, indium, or copper, which metals are major contaminants for ion implantation.

SUMMARY OF THE INVENTION

An object of the present invention is thus to propose heater means avoiding the above-mentioned limitations, and doing so when the substrate carrier is biased at high voltage.

According to the invention, a support comprises:
an electrically conductive biased table connected to a high voltage power supply and supported on an electrically insulating stand;
an electrically insulating substrate carrier in the form of a cylinder, its top face presenting a bearing plane designed to receive a substrate;
legs standing on the biased table in order to support the bottom face of the substrate carrier; and
at least one electrically conductive connection for connecting the bearing plane to the biased table;
the support is remarkable in that the substrate carrier incorporates a heating resistance.

Such an arrangement satisfies the problem posed since it makes it possible to heat the substrate to high temperature and to bias it at high voltage.

According to an additional characteristic, the substrate carrier is provided with a shoulder at its base and further includes an electrically conductive clamping flange for clamping the shoulder against the biased table.

Under such circumstances, the support includes at least one electrically conductive element for connecting the bearing plane to the shoulder.

Advantageously, the electrically conductive element comprises:
- a first strip arranged at the periphery of the top face;
- a second strip that extends on the cylinder between the first strip and the shoulder;
- a third strip in contact with the second strip and arranged on the shoulder; and
- electrically conductive springs arranged between the third strip and the flange.

Preferably, the support includes at least one thermal screen interposed between the bottom face of the substrate carrier and the biased table.

According to an additional characteristic, the support includes a temperature probe in contact with the substrate carrier.

By way of example, the temperature probe is connected to a regulator member that powers the heating resistance.

In a preferred embodiment, the biased table incorporates a cooling grid.

BRIEF DESCRIPTION OF THE DRAWING

The present invention appears below in greater detail from the following description of an embodiment given by way of illustration and with reference to the sole accompanying FIGURE, which is a diagrammatic section view of the support of the invention.

DETAILED DESCRIPTION OF THE INVENTION

With reference to the FIGURE, the support essentially comprises four portions:
- a bias table 10;
- a substrate carrier 20;
- a clamping flange 30; and
- a stand 40;

The stand 40 is a member secured to the implantation enclosure on which the table 10 is supported. It is electrically insulating.

The table 10 has a duct 11 passing therethrough and opening out firstly into the substrate carrier 20 and secondly to the outside. The function of this duct 11 is described in detail below.

The table 10 is electrically conductive and in the form of a plate connected to a high voltage power supply 12 that operates in direct current (DC) mode or in pulsed mode.

In a preferred embodiment, the table 10 is cooled. By way of example, a grid 13 of cooling tubes is embedded in the table. This grid is fed with any electrically insulating fluid known to the person skilled in the art. By way of example, it may be deionized water possibly with added glycol, or it may be oil.

The substrate carrier 20 is electrically insulating. It is supported on the table 10 via legs 15. It is in the form of a cylinder having a shoulder 21 that projects from its base.

The clamping flange 30 serves to clamp the substrate carrier 20 against the legs 15. It is electrically conductive. Firstly it is fastened to the periphery of the table 10 by any means. Secondly it presses against the shoulder 21 via springs 31, which are likewise electrically conductive and which absorb differential expansion.

The top face of the substrate carrier 20 presents a recess 22, defining a ring 23 at its periphery. The thickness of the ring 23 typically lies in the range 10 micrometers (μm) to 15 μm. The top of the ring defines a bearing plane on which the substrate 50 is supported.

A series of electrodes 25 serves to provide electrostatic clamping for the substrate. The electrodes are distributed in pairs. They are arranged in a plane parallel to the top face of the substrate 50, immediately below the recess 22. They are made by any means known to the person skilled in the art, for example having recourse to so-called "thick layer" technology. The principle consists in making two capacitors:
- an anode-to-substrate capacitor; and
- a substrate-to-cathode capacitor.

Returning to the duct 11, it is used to fill the recess 22 with gas. The heat transfer gas is commonly helium or hydrogen at a pressure lying in the range 1 torr to 20 torr. Its function is to transmit heat from the substrate carrier 20 to the rear face of the substrate 50.

Optionally, provision may be made for a member to discharge the heat transfer gas. The gas is pumped through a circuit that is filled, during application of the high voltage, with another gas that is not suitable for generating a plasma, e.g. nitrogen, at a pressure that is greater than one atmosphere. This avoids triggering a discharge plasma in the circuit when applying the high voltage.

Consideration is given to the system that ensures electrical continuity between the table 10 and the substrate 50.

A first metal strip 201 is arranged on the ring 23 that appears at the periphery of the top face of the substrate carrier 20. By way of example, the strip is made using so-called "thin layer" technology with a material such as titanium, titanium nitride, platinum, tungsten, or tungsten carbide. In any event, it must be material that is conductive, and that is also refractory, if possible.

The thickness of the strip must be sufficient to present acceptable electrical resistance, but it must not be too great. A suitable value for this thickness lies in the range 1 μm to 3 μm.

A second metal strip 202 is deposited on the cylindrical wall of the substrate carrier 20 between the first strip 201 and the shoulder 21.

Finally, a third metal strip 203 is deposited on the face of the shoulder 21 that faces the clamping flange 30.

The three strips that are juxtaposed in this way provide electrical continuity from the bearing face to the clamping flange, which is itself conductive.

Specifically, the springs 31 are also electrically conductive.

The substrate carrier 20 is heated by a heater resistance 26. This resistance may be adhesively bonded. It may also be integrated in the substrate carrier 20. It may also be deposited, e.g. as a thick layer.

The temperature of the substrate carrier 20 is monitored by means of a temperature probe 27. The probe may be a thermocouple, a thermoresistance, a platinum probe, or a pyrometer. It is connected to a regulator member 28 that powers the heater resistance 26. The regulator member 28 serves to maintain a stable temperature regardless of the amount of energy delivered by the plasma.

Provision is preferably made for one or more screens 29 (three in the FIGURE) that are interposed between the base of the substrate carrier 20 and the biased table 10. This limits exchanges of heat between those two elements. The screens may be reflective or thermally insulating.

It can be seen that all of the following pieces of equipment are taken to the bias voltage:
- converter 28 of the temperature probe 27;
- power supply of the heater resistance 26;

power supply of the electrodes 25 of the substrate carrier 20; and pressure regulator of the heat transfer gas.

An optical fiber communication module is thus provided for enabling these pieces of equipment to communicate with the regulating controller.

By way of indication, there follows an example of a method of implanting using the above-described support:

bringing the substrate carrier 20 up to temperature;

loading the substrate 50 on the substrate carrier 20;

preheating the substrate for 10 seconds (s) to 30 s;

activating the electrodes 25 for clamping the substrate 50;

injecting the heat transfer gas into the duct 11 at a pressure in the range 3 torr to 10 torr;

implanting ions;

stopping injection of the heat transfer gas and pumping out the gas;

deactivating the clamping electrodes 25; and unloading the substrate 50.

Finally, it is specified that the electrical connection between the substrate and the biased table may be provided in numerous ways. For example, there may be plated-through holes for providing contact between the bearing plane and the base or bottom face of the substrate carrier. It is also possible to provide metal inserts instead of plated-through holes. Electrical continuity is then provided by the legs, which are then electrically conductive.

The embodiments of the invention described above have been selected because of their concrete nature. Nevertheless, it is not possible to list exhaustively all possible embodiments covered by the invention. In particular, any of the means described may be replaced by equivalent means without going beyond the ambit of the present invention.

The invention claimed is:

1. A support comprising:

an electrically conductive biased table connected to a high voltage power supply and supported on an electrically insulating stand;

an electrically insulating substrate carrier in the form of a cylinder, its top face presenting a bearing plane designed to receive a substrate;

legs standing on said biased table in order to support the bottom face of said substrate carrier; and at least one electrically conductive connection for connecting said bearing plane to said biased table;

the support being characterized in that said substrate carrier incorporates a heating resistance.

2. A support according to claim 1, characterized in that said substrate carrier is provided with a shoulder at its base and further includes an electrically conductive clamping flange for clamping said shoulder against said biased table.

3. A support according to claim 2, characterized in that it includes at least one electrically conductive element for connecting said bearing plane to said shoulder.

4. A support according to claim 3, characterized in that said electrically conductive element comprises:

a first strip arranged at the periphery of said top face;

a second strip that extends on said cylinder between said first strip and said shoulder;

a third strip in contact with said second strip and arranged on said shoulder; and electrically conductive springs arranged between the third strip and said flange.

5. A support according to claim 1, characterized in that it includes at least one thermal screen interposed between the bottom face of said substrate carrier and said biased table.

6. A support according to claim 1, characterized in that it includes a temperature probe in contact with said substrate carrier.

7. A support according to claim 6, characterized in that said temperature probe is connected to a regulator member that powers said heating resistance.

8. A support according to claim 1, characterized in that said biased table incorporates a cooling grid.

* * * * *